(12) United States Patent
Copeland et al.

(10) Patent No.: US 7,804,687 B2
(45) Date of Patent: Sep. 28, 2010

(54) LIQUID-COOLED RACK WITH PRE-COOLER AND POST-COOLER HEAT EXCHANGERS USED FOR EMI SHIELDING

(75) Inventors: David W. Copeland, Mountain View, CA (US); Andrew R. Masto, San Jose, CA (US); Marlin R. Vogel, Fremont, CA (US)

(73) Assignee: Oracle America, Inc., Redwood City, CA (US)

( * ) Notice: Subject to any disclaimer, the term of this patent is extended or adjusted under 35 U.S.C. 154(b) by 116 days.

(21) Appl. No.: 12/188,734

(22) Filed: Aug. 8, 2008

(65) Prior Publication Data

US 2010/0033921 A1 Feb. 11, 2010

(51) Int. Cl.
*H05K 7/20* (2006.01)
*F28F 7/00* (2006.01)
*H01L 23/34* (2006.01)

(52) U.S. Cl. .................. 361/701; 361/699; 361/724; 361/818; 165/80.4; 165/80.5; 165/104.33; 165/181; 257/714

(58) Field of Classification Search .......... 361/698–699, 361/701–703, 724–727, 818; 165/80.4–80.5, 165/104.33, 152, 104.21, 119, 122, 181; 257/714; D23/386, 393
See application file for complete search history.

(56) References Cited

U.S. PATENT DOCUMENTS

| 6,297,446 | B1 * | 10/2001 | Cherniski et al. | 174/383 |
| 6,478,082 | B1 * | 11/2002 | Li | 165/185 |
| 2005/0207116 | A1 * | 9/2005 | Yatskov et al. | 361/690 |
| 2005/0231910 | A1 * | 10/2005 | Malone et al. | 361/695 |

* cited by examiner

*Primary Examiner*—Zachary M Pape
(74) *Attorney, Agent, or Firm*—Osha Liang LLP

(57) ABSTRACT

A cooling system for a rack-mount server includes a fan disposed within the rack-mount server and configured to produce an airflow through the rack-mount server, and a heat exchanger disposed within the rack-mount server in a path of the airflow through the rack-mount server. The heat exchanger includes a liquid circulation path structure and an airflow path structure. The airflow path structure is configured to shield electromagnetic interference.

10 Claims, 4 Drawing Sheets

US 7,804,687 B2

LIQUID-COOLED RACK WITH PRE-COOLER AND POST-COOLER HEAT EXCHANGERS USED FOR EMI SHIELDING

BACKGROUND OF INVENTION

Modern rack-mount server systems include single and multiple liquid heat exchangers that cool air through a rack-mount server system to enable the deployment of high density electronic modules ("blades") within the system. As well as the other electronic systems, rack-mount server systems also include structures and/or devices for shielding electromagnetic interference ("EMI") from the blades. Due to the ever-increasing desire to include more electronic components in individual blades and mount more blades in a particular rack, saving space inside a rack-mount server system is an important concern. Further, as more electronics are included within a given system, the system necessarily produces higher EMI emissions.

SUMMARY

One or more embodiments of the present invention relate to a cooling system for a rack-mount server comprising: a fan disposed within the rack-mount server and configured to produce an airflow through the rack-mount server; and a heat exchanger disposed within the rack-mount server in a path of the airflow through the rack-mount server, wherein the heat exchanger comprises a liquid circulation path structure and an airflow path structure, and wherein the airflow path structure is configured to shield electromagnetic interference.

One or more embodiments of the present invention relate to a heat exchanger comprising: a coolant circulation path structure for circulating coolant; and an airflow path structure in thermal contact with the coolant circulation path structure such that heat from air passing through the airflow path structure transfers to the coolant, wherein the airflow path structure is configured to shield electromagnetic interference.

Other aspects and advantages of the invention will be apparent from the following description and the appended claims.

DETAILED DESCRIPTION

Specific details of the present disclosure will now be described in detail with reference to the accompanying figures.

Figure 1:
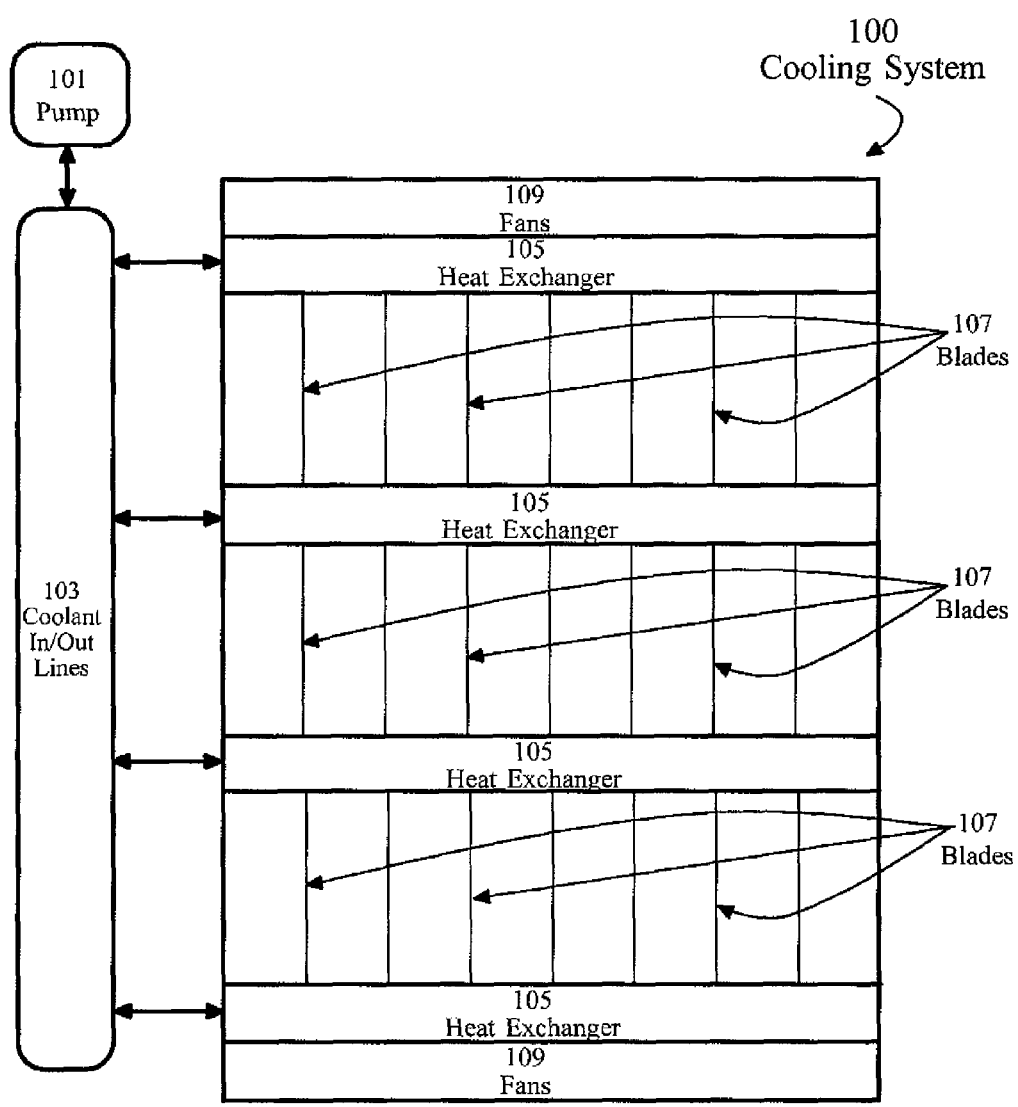
FIG. 1 shows a front view of a rack-mount server system in accordance with one or more embodiments of the present invention.

Referring now to FIG. 1, a front view of a cooling system for a rack-mount server in accordance with one or more embodiments of the present invention is shown. In one or more embodiments, the cooling system 100 includes a pump 101, cooling intake/outtake lines 103, a plurality of heat exchangers 105, a plurality of blades, or electronic components, 107, and a plurality of fans 109. The fans 109 are configured at the top and bottom of the rack-mount server to blow air through the heat exchangers 105 in order to cool the blades 107. The blades 107 are mounted in different positions throughout the chassis of the rack, and a plurality of heat exchangers 105 are disposed therebetween.

Each heat exchanger 105 is configured to take in coolant, e.g., chilled water or refrigerant in liquid or gas form, from the cooling intake/outtake line 103, chill air flowing across the heat exchanger 105, and return warmed liquid through the cooling intake/outtake lines 103. The pump 101 may maintain pressure through the cooling intake/outtake lines 103. Thus, the heat exchangers 105 include a coolant circulation path structure for containing the circulated coolant in thermal contact with an airflow path structure for allowing airflow through the heat exchanger such that heat is transferred between the circulated coolant and the flowing air. The airflow path structure (not shown in FIG. 1) also functions to shield EMI from the blades 107.

Figure 2A:
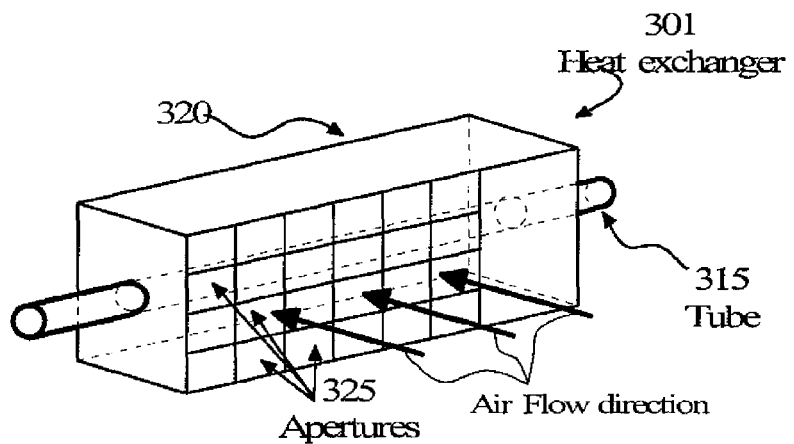
FIG. 2(A) shows a perspective view of a heat exchanger in accordance with one or more embodiments of the present invention.
Figure 2B:
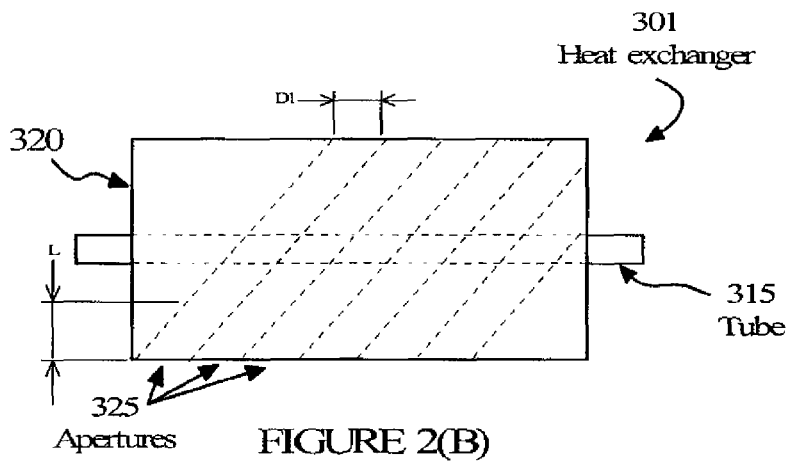
FIG. 2(B) shows a top view of a heat exchanger in accordance with one or more embodiments of the present invention.
Figure 2C:
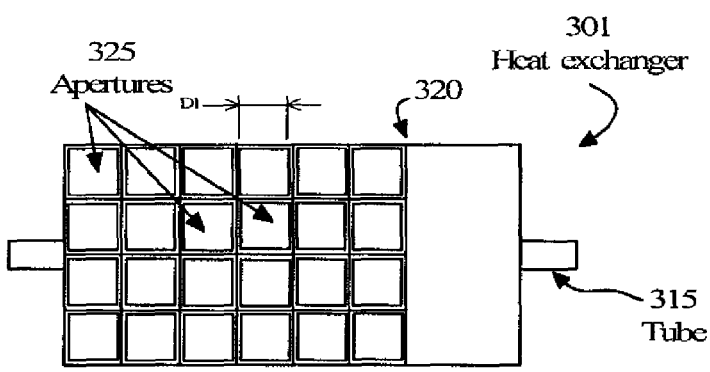
FIG. 2(C) shows a front view of a heat exchanger in accordance with one or more embodiments of the present invention.

Referring now to FIGS. 2(A), 2(B), and 2(C), perspective, top, and front views, respectively, of a heat exchanger 301 for cooling system for a rack-mount server in accordance with one or more embodiments of the present invention. As can be seen, the heat exchanger 301 includes a coolant circulation path structure 315 and an airflow path structure 320. The coolant circulation path structure 315 may be a tube configured to transport cooled liquid and return warmed liquid to, for example, the cooling intake/outtake line 103 shown in FIG. 1. The airflow path structure 320 is arranged at an outer circumferential of the coolant circulation path structure 315. The airflow path in the structure 315 is directed to cross over the coolant circulation path structure 315. As shown in FIG. 2(B), the airflow path is preferably declined to the perpendicular direction to the coolant circulation path structure 315. The airflow path structure 320 is exposed to the airflow through the heat exchanger 150 and is in thermal contact with the coolant circulation path structure 315, so as to transfer the heat between the airflow and the coolant within the coolant circulation path structure 315.

The airflow path structure 320 is preferably made from a material with high heat conductivity and high electromagnetic absorption properties, such as metals and combinations thereof with, e.g., ceramic, glass, glass fiber, or the like. Referring to FIGS. 2(A), 2(B) and 2(C), in one or more embodiments of the present invention, the airflow path structure 320 is arranged at the outer circumference of the coolant circulation path structure 315 as a three-dimensional structure including a plurality of square shaped apertures, or a multi-layer structure in which a plurality of mesh or lattice-like structures are combined. The embodiments of the lattice-like structure would include simple, staggered, wavy, and louvered fins used in compact heat exchanger design. The mesh or lattice-like structures is preferably designed such that the size D1 of every aperture and the length L of the direct line of sight through the aperture are less than three millimeters for efficient shielding of EMI from the blades 107.

Figure 3:
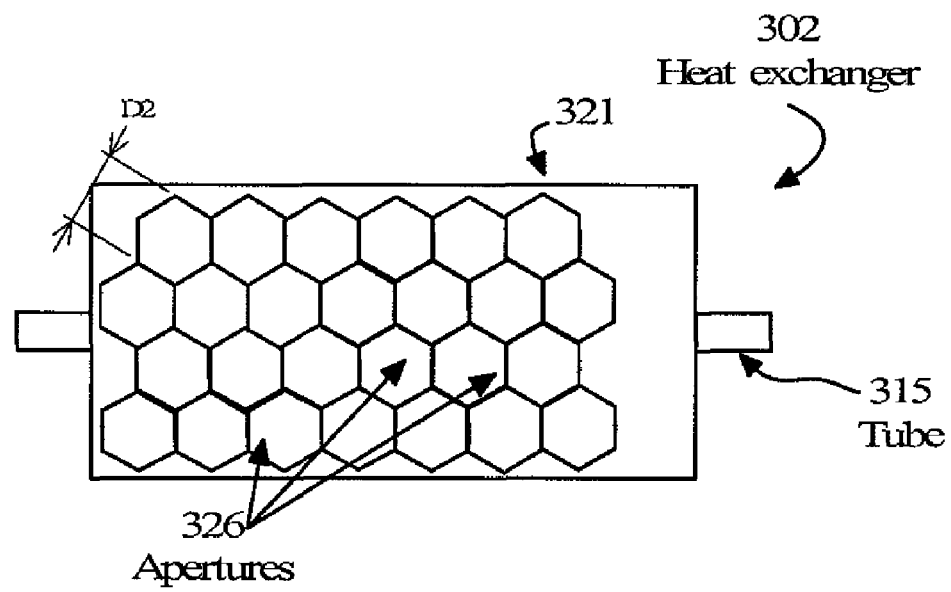
FIG. 3 shows a front view of a heat exchanger in accordance with one or more embodiments of the present invention.

Referring now to FIG. 3, a front view of a heat exchanger 302 in accordance with one or more embodiments of the present invention is shown. The heat exchanger 302 includes an airflow path structure with a honeycomb structure having a plurality of apertures 326 of hexagonal shapes. The size D2 of each hexagonal shaped aperture and the length of the direct line of sight through the aperture are preferably designed to be less than three millimeters for efficient shielding of EMI from the blades 107.

The apertures 326 may be, for example, formed as through holes on plate-shaped fins arranged at the outer circumference of the coolant circulation path structure 315. In such a case, the plate-shaped fins may be connected in a three-dimensional structure including a plurality of apertures of hexagonal shapes at various angles. The size D2 of each hexagonal shaped aperture 326 and the length of the direct line of sight through the aperture are preferably designed to be less than three millimeters for efficient shielding of EMI from the blades 107.

Figure 4:
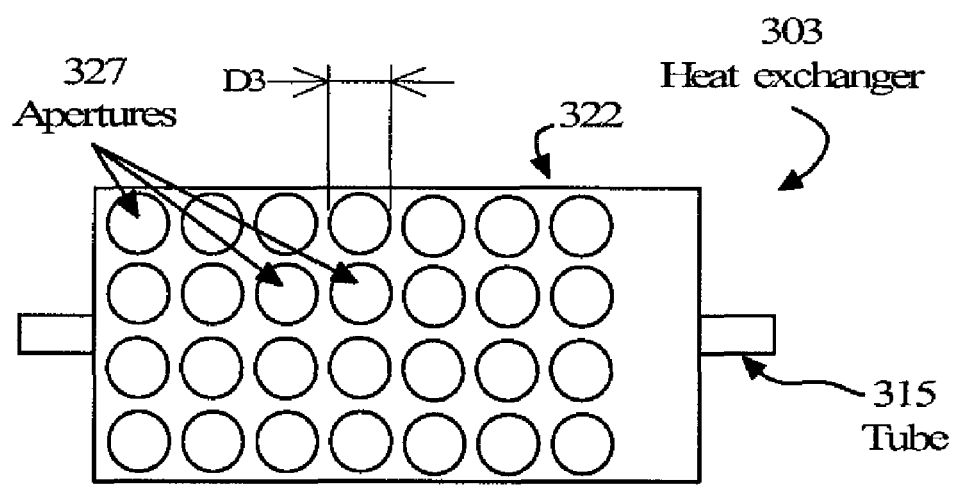
FIG. 4 shows a front view of a heat exchanger in accordance with one or more embodiments of the present invention.

Referring now to FIG. 4, a front view of a heat exchanger 303 in accordance with one or more embodiments of the present invention is shown. The heat exchanger 303 includes an airflow path structure having a plurality of apertures 327 of circular shapes. The apertures 326 are, for example, formed as through holes on the plate shaped fins arranged in series at the outer circumference of the coolant circulation path structure 315. The airflow path in the structure 327 is directed to cross over the coolant circulation path structure 315. The airflow path is preferably declined to the perpendicular direction to the coolant circulation path structure 315. The diameter D3 of each circular shaped aperture 327 is preferably designed to be less than three millimeters for efficient shielding of EMI from the blades 107. The airflow path structure 320 is arranged at an outer circumferential of the coolant circulation path structure 315.

Those skilled in the art will appreciate various other shapes, such as ellipsoid, polygonal shapes, and the like, may be used and a combination of shapes may be used together without departing from the spirit of the present invention. In each case, the size of apertures and the length of the direct line of sight through the apertures are preferably designed to be less than three millimeters for efficient shielding of EMI from the blades 107.

Figure 5:
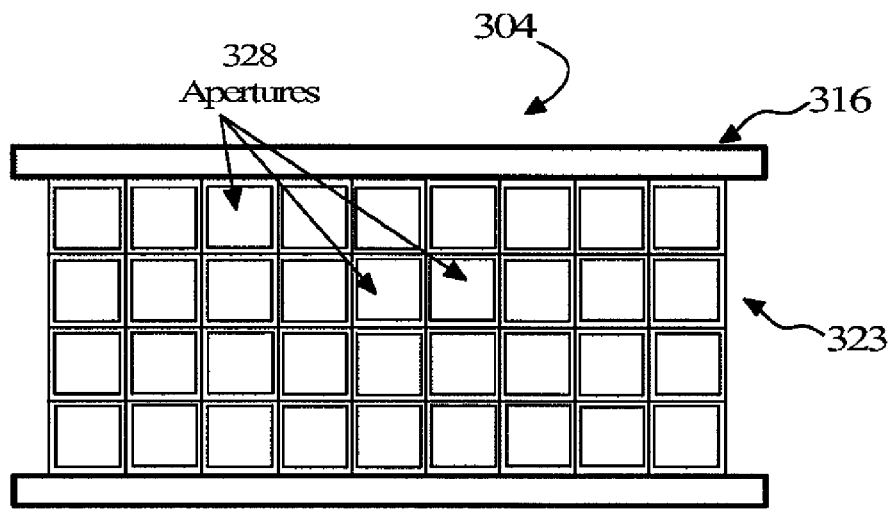
FIG. 5 shows a front view of a heat exchanger in accordance with one or more embodiments of the present invention.

Referring to FIG. 5, a front view of a heat exchanger 304 in accordance with one or more embodiments of the present invention is shown. In the embodiment shown, two coolant circulation path structures 316 are configured as flattened tubes for transporting cooled liquid from and return warmed liquid to, for example, the cooling intake/outtake line 103 shown in FIG. 1, and an airflow path structure 323 is arranged between the two coolant circulation path structures 316. The airflow path structure 323 is arranged to cross the coolant circulation path structure 315 as a three-dimensional structure including a plurality of square shaped apertures 328, or a multi-layer structure in which a plurality of mesh or lattice-like structures are combined. The embodiments of the lattice-like structure would include simple, staggered, wavy, and louvered fins used in compact heat exchanger design. The mesh or lattice-like structures is preferably designed such that the size of every aperture and the length of the direct line of sight through the aperture are less than three millimeters for efficient shielding of EMI from the blades 107.

Figure 6:
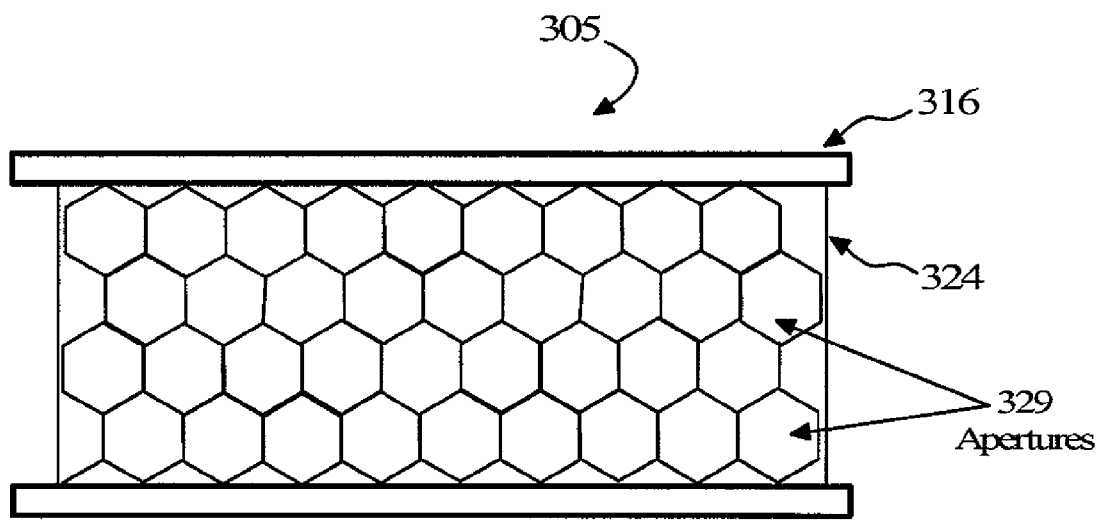
FIG. 6 shows a front view of a heat exchanger in accordance with one or more embodiments of the present invention.

FIG. 6 is a front view of the heat exchanger 305 in accordance with one or more embodiments of the present invention is shown. Similar to the embodiment shown in FIG. 5, an airflow path structure 324 is arranged between the two coolant circulation path structures 316 such that the airflow path structure 324 is arranged to cross the coolant circulation path structure 316. As can be seen, airflow path structure 324 has a honeycomb structure having a plurality of apertures 329 of hexagonal shapes. The apertures 329 are, for example, formed as through holes on base material arranged between the two coolant circulation path structures 316. The size of each hexagonal shaped aperture 329 and the length of the direct line of sight through the aperture are preferably designed to be less than three millimeters for efficient shielding of EMI from the blades 107.

Embodiments of the cooling system disclosed herein may exhibit one or more of the following advantages. The above structures of the heat exchangers include a liquid circulation path structure and an airflow path structure for allowing airflow through the heat exchanger such that heat is transferred between the circulated liquid and the flowing air. The airflow path structure is also configured to shield EMI from the blades. One or more embodiments achieve efficient cooling and EMI shielding in one component. Due to the multiple functions the airflow path structure, the space used inside a rack-mounted server system may be advantageously reduced. Additionally, the cost of the rack-mounted server system may be advantageously reduced.

Though the exemplary embodiments discussed above have been set forth with one heat exchanger disposed before and after a blade, the invention is not so limited. For example, any number of heat exchangers may be disposed within the chassis of the rack depending on the heat densities of the components installed therein. Also, the number and location of the fans may be changed depending on a particular system.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A cooling system for a rack-mount server comprising:
   a fan disposed within the rack-mount server and configured to produce an airflow through the rack-mount server; and
   a heat exchanger disposed within the rack-mount server in a path of the airflow through the rack-mount server,
   wherein the heat exchanger comprises a coolant circulation path structure and an airflow path structure in thermal contact, and
   wherein the airflow path structure comprises a plurality of apertures having no dimension equal to or greater than three millimeters such that the plurality of apertures allow airflow therethrough while to shielding electromagnetic interference.

2. The cooling system of claim 1, wherein the coolant circulation path structure comprises a tube, and the airflow path structure is arranged at an outer circumference of the tube.

3. The cooling system of claim 1, wherein the coolant circulation path structure comprises two flattened tubes, and the airflow path structure is arranged between the two flattened tubes.

4. The cooling system of claim 1, wherein the plurality of apertures are square-shaped.

5. The cooling system of claim 1, wherein the plurality of apertures are circular-shaped.

6. The cooling system of claim 1, wherein the plurality of apertures are hexagonal-shaped.

7. The cooling system of claim 6, wherein the plurality of hexagonal-shaped apertures form a honeycomb construction.

8. The cooling system of claim 1, further comprising a cooling line attached the heat exchanger and a pump, wherein the pump circulates coolant through the heat exchanger.

9. The cooling system of claim 8, wherein the coolant is chilled water.

10. A heat exchanger comprising:
a coolant circulation path structure for circulating coolant; and
an airflow path structure in thermal contact with the coolant circulation path structure such that heat from air passing through the airflow path structure transfers to the coolant,
wherein the airflow path structure comprises a plurality of apertures having no dimension equal to or greater than three millimeters such that the plurality of apertures allow airflow therethrough while shielding electromagnetic interference.

* * * * *

UNITED STATES PATENT AND TRADEMARK OFFICE
CERTIFICATE OF CORRECTION

PATENT NO. : 7,804,687 B2  Page 1 of 1
APPLICATION NO. : 12/188734
DATED : September 28, 2010
INVENTOR(S) : David W. Copeland et al.

It is certified that error appears in the above-identified patent and that said Letters Patent is hereby corrected as shown below:

In Claim 1, Column 4, line 52, the words "while to shielding" should read --while shielding--.

Signed and Sealed this

Fourteenth Day of December, 2010

David J. Kappos
*Director of the United States Patent and Trademark Office*